United States Patent [19]

Coombe

[11] Patent Number: 5,382,457
[45] Date of Patent: Jan. 17, 1995

[54] NEAR-RESONANT LASER SPUTTERING METHOD

[75] Inventor: Robert D. Coombe, Lakewood, Colo.

[73] Assignee: Colorado Seminary, Denver, Colo.

[21] Appl. No.: 130,096

[22] Filed: Sep. 30, 1993

[51] Int. Cl.⁶ .......................... B05D 3/06; B05D 5/06
[52] U.S. Cl. ................... 427/596; 427/126.3; 204/298.02; 204/192.26
[58] Field of Search ............ 427/596, 126.3; 118/620; 204/298.02, 192.26, 192.18, 192.25

[56] References Cited

U.S. PATENT DOCUMENTS 5,017,277  5/1991  Yoshida et al. ............ 204/298.02
5,168,097 12/1992  Araya et al. ............... 427/596

OTHER PUBLICATIONS

Ogasawara et al, "Preparation of Oxide Thin Films by Laser Ablation", Jpn. J. Appl. Phys. vol. 31, Part 1, No. 9B, Sep. 1992, pp. 2971–2974.
Ludorf et al, "In Situ Preparation of Bi-Sr-Ca-Cu-O Superconducting Films by Laser Sputtering", Appl. Phys. A49, (1989), pp. 221–223.
R. D. Coombe et al., Energy Transfer Between Electronically Excited Zinc and Calcium Atoms, Jan. 15, 1981, pp. 1044–1046, Journal of Chemistry and Physics vol. 74, No. 2.
R. D. Coombe et al., UV Laser-Induced Deposition of Metal Films, Nov. 1, 1980, pp. 846–848, Applied Physics Letters, vol. 37, No. 9.
Van de Pol, Thin-Film ZnO-Properties and Applications, 1990, pp. 1959–1965, Ceramic Bulletin vol. 69, No. 12.
T. Nakayama, Laser-Induced Sputtering of ZnO, TiO₂, CdSe and GaP Near Threshold Laser Fluence, 1983, pp. 101–113, Surface Science vol. 133.
R. Solanki et al, Laser Induced Deposition of Zinc Oxide, Apr. 15, 1983, pp. 662–663, Applied Physics Letters vol. 42, No. 8.
H. Sankur et al., Highly Oriented ZNO Films Grown by Laser Evaporation, Oct. 1983, pp. 1806–1810, Journal of Vacuum Science Technology vol. 1, No. 4.

Primary Examiner—Roy V. King
Attorney, Agent, or Firm—Dorr, Carson, Sloan & Peterson

[57] ABSTRACT

A method for sputtering atoms from a target made of a group II metal using a laser is provided. A sputter target and substrate are located in a vacuum chamber. The laser frequency is chosen to be near-resonant with an electronic transition in the group II metal from a ground state to an excited metastable state. As the sputtered atoms leave the target surface, the near-resonant laser energy excites the sputtered atoms. The excited atoms are sputtered into an ambient of molecules containing group VI atoms in the vacuum chamber where they react to form a II–VI compound that deposits on the substrate.

13 Claims, 3 Drawing Sheets

NEAR-RESONANT LASER SPUTTERING METHOD

BACKGROUND OF THE ART

1. Field of the Invention

The present invention relates to a laser sputtering apparatus and method for producing thin films and, more particularly, to a laser sputtering apparatus and method using a laser frequency selected to excite the target atoms into a reactive state.

2. Statement of the Problem

Thin films of direct bandgap II-VI compounds are important photovoltaic materials useful in optics, photonics, and microelectronics. A variety of thin film deposition methods for II-VI compounds are described in "Thin-Film ZnO—Properties and Applications" by Frans C. M. Van de Pol published in *Ceramic Bulletin* Vol. 69 No. 12 (1990). Included are methods of chemical vapor deposition, evaporation of Zn with an oxygen beam, high-frequency plasma evaporation, molecular beam epitaxy, and conventional radio frequency (RF) reactive sputtering of Zn in an oxygen ambient.

Sputtering is a well-known technique for producing thin films. Conventional sputtering systems use RF energy to create a plasma inside a low-pressure vacuum chamber. The plasma comprises ions that are directed at a surface of a sputter target. The plasma gives the ions a great deal of kinetic energy so that as they impact the target surface, they remove clusters of atoms or molecules from a surface of a sputter target. The atoms and molecules that are removed then travel through the low-pressure vacuum chamber to deposit onto a surface of a substrate.

In some sputtering systems, the sputtered atoms are caused to chemically react with reagent gases in the vacuum chamber as they leave the surface of the target. These techniques are called "reactive sputtering" and are useful for providing some types of molecular thin films. Because chemical reactions between the group II metals and the group VI reagent compounds are generally endothermic, reactive deposition methods of these materials require the input of energy from some external source. The external energy can be from substrate heating or RF glow discharge through the reagent gases.

Low-temperature deposition is desirable where the substrate upon which the film is deposited contains material that is sensitive to high temperature. One advantage of sputtering is that the thin film deposition occurs at moderate temperature. However, RF plasma sputtering still requires elevated temperatures of several hundred degrees Celsius, and may require that the substrate itself be heated. Reactive ion sputtering often requires even higher temperatures to give the ions sufficient energy to induce a chemical reaction. A method for low- or near-room-temperature thin film deposition is needed.

RF energy can damage delicate microelectronic structures in a substrate. Also, it is often difficult to control the stoichiometry of reactively sputtered films because the RF plasma contains ions with a wide variety of energies which react with the sputtered atoms to create a correspondingly wide variety of compounds. This is a particular problem when reactive sputtering is performed at low temperature. What is needed is a thin film deposition apparatus that provides highly reproducible and uniform thin films without requiring RF energy to cause a chemical reaction.

U.S. Pat. No. 5,017,277 issued to Yoshida et al. on May 21, 1991, describes a non resonant laser sputtering apparatus. This apparatus uses a laser to sputter material from a target located inside a vacuum chamber to a substrate mounted inside the vacuum chamber. The apparatus optionally includes an RF plasma mechanism to allow reactive sputtering and to prevent decomposition of the sputtered molecules. In all cases, the target comprises substantially the same material as the sputtered product.

"Laser-Induced Sputtering of ZnO, TiO$_2$, CdSe, and GaP Near Threshold Laser Fluence" by Takeyoshi Nakayama published in *Surface Science* Vol. 133 (1983) describes a method of laser sputtering zinc oxide. This paper reports results of the mechanics of non resonant laser sputtering at various laser intensities. In all of the experiments, the sputter product was either substantially similar to the composition of the sputter target or included ions decomposed from the sputter target. No reactive sputtering is reported.

"Laser Induced Deposition of Zinc Oxide" by R. Solanki and G. J. Collins published in *Applied Physics Letters* Volume 42(8) (1983) describes a chemical vapor deposition system using non-resonant laser energy to decompose dimethylzinc and nitrogen dioxide to form zinc oxide. This method did not involve sputtering and was instead concerned with decomposition of a zinc compound as opposed to reactively sputtering zinc.

"Highly Oriented ZnO Films Grown by Laser Evaporation" by H. Sankur and J. T. Cheung published in *Journal of Vacuum Science Technology* vol. 1, no. 4 (1983), describes a method of using a non resonant laser to heat a target to evaporate material from the target onto a substrate. The evaporated films were substantially similar in composition to the target. No reactive evaporation or sputtering is reported.

A need exists for an apparatus and method for forming uniform thin films of II-VI compounds at low temperature without RF fields. A further need exists for a method of laser sputtering that induces a chemical reaction between the sputtered atoms and reagent gases without requiring additional external energy.

3. Solution of the Problem

The present invention provides a solution to the above problem by providing an apparatus and method for laser sputtering atoms from a target comprising a group II metal. A laser frequency is chosen to be near-resonant with an electronic transition in the group II metal from a ground state to a metastable state. As the sputtered atoms leave the target surface, the near-resonant laser energy excites the sputtered atoms. The excited atoms are sputtered into the vacuum chamber, where they react with the group VI reagent gases to form a II-VI compound that deposits as a highly uniform polycrystalline thin film on a substrate located in the vacuum chamber.

SUMMARY OF THE INVENTION

The present invention provides an apparatus and method for sputtering atoms from a target comprising a group II metal using a laser. The target is located in a vacuum chamber. The laser frequency is chosen to be near-resonant with an electronic transition in the group II metal from a ground state to an excited metastable state. As the sputtered atoms leave the target surface, the near-resonant laser energy excites the sputtered atoms. The excited atoms are sputtered into an ambient of molecules comprising group VI atoms in the vacuum chamber, where they react to form a II–VI compound that deposits on a substrate located in the vacuum chamber.

DETAILED SPECIFICATION

1. Laser Sputtering Apparatus

Figure 1:
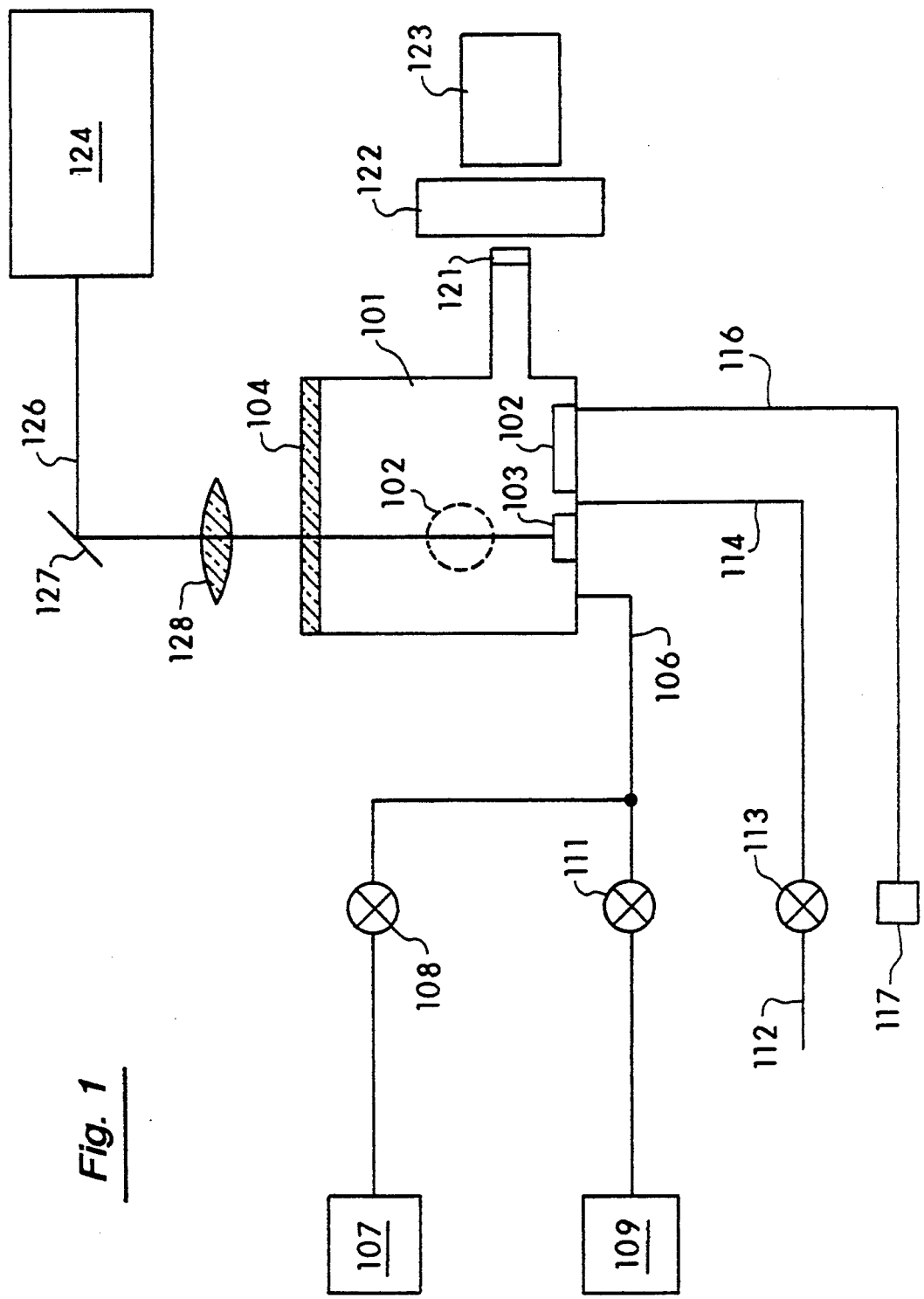
FIG. 1 illustrates a schematic diagram of a near-resonant laser sputtering apparatus in accordance with the present invention.

FIG. 1 illustrates a laser sputtering apparatus in accordance with the present invention. The laser sputtering apparatus comprises a vacuum chamber 101 in that are positioned substrates 102. Substrates 102 comprise a material upon which it is desired to deposit a thin film of II–VI compound material. Substrates 102 may be dielectric, semiconducting or insulator and may include integrated circuitry fabricated thereon. Target 103 is positioned in vacuum chamber 101 in proximity to substrates 102. Target 103 is a conventional sputtering target and a preferred embodiment comprises a material from a group II element such as zinc (Zn) or cadmium (Cd). In the preferred embodiment, substrates 102 are arranged at right angles to target 103. However, it should be understood that a large variation in the orientation between substrates 102 and target 103 is possible depending on the particular apparatus used. Commercially available laser sputtering apparatus can easily be adapted for use with the method of the present invention.

A transparent quartz window 104 is provided in vacuum chamber 101 to allow laser beam 126 to pass into vacuum chamber 101. A vacuum line 106, reagent gas line 114, and pressure gauge line 116 also connect to vacuum chamber 101. Mechanical pump 107 connects through valve 108 to vacuum line 106 and is used for producing a rough vacuum inside vacuum chamber 101. Diffusion pump 109 is coupled through valve 111 to vacuum line 106 and is used for providing a high vacuum inside vacuum chamber 101. Pressure gauge 117 is connected to pressure gauge line 116 to monitor pressure inside vacuum chamber 101, as is conventionally done in sputtering apparatus.. The design and operation of mechanical pump 107, diffusion pump 109, and pressure gauge 117 are well known.

Reagent gases are provided to vacuum chamber 101 through gas inlet 112. Gas inlet 112 is coupled through valve 113 to reagent gas line 114. In accordance with the method of the present invention, reagent gases comprise molecules containing group VI atoms such as oxygen ($O_2$), carbon disulfide ($CS_2$) and hydrogen sulfide ($H_2S$). The reagent gases are preferably electronic or reagent grade and are available from many commercial sources.

A number of methods can be used to monitor the reaction ongoing inside vacuum chamber 101 during the sputtering process. As shown in FIG. 1, vacuum chamber 101 is provided with a transparent quartz window 121 that allows light generated during the reaction to pass out of vacuum chamber 101. Light passing through quartz window 121 then passes through monochromator 122 to a photomultiplier 123. Photomultiplier 123 produces an electrical signal proportional to the magnitude of light reaching it from monochromator 122 and so can be used to monitor a reaction going on inside vacuum chamber 101. Many other methods of monitoring reactions are well known and equally suited in the practice of the present invention.

Laser 124 is used to provide laser energy to sputter atoms from target 103 as is done in a conventional laser sputtering apparatus. An important feature of the present invention is that laser 124 is also used to excite the sputtered atoms to a reactive metastable state, as described in greater detail hereinbelow. Laser 124 produces laser beam 126 that is reflected from a mirror 127 to a focusing lens 128. Laser beam 126 then passes through transparent quartz window 104 to sputter target 103.

Laser beam 126 is preferably a pulsed laser beam from an excimer laser. In the preferred embodiment, when target 103 comprises zinc (Zn), laser 124 is a xenon chloride (XeCl) excimer laser producing a laser beam 126 having a wavelength of 308 nanometers. An important feature of the present invention is that the output wavelength of laser 124 is chosen to be near-resonant with an energy required to cause an electronic transition in the atoms of the target material of target 103. This particular selection for the output wavelength of laser 124 results in surprisingly increased sputter yields and reactive sputtering in a low-temperature environment less than about 300K.

2. Resonant Laser Sputtering

Figure 2:
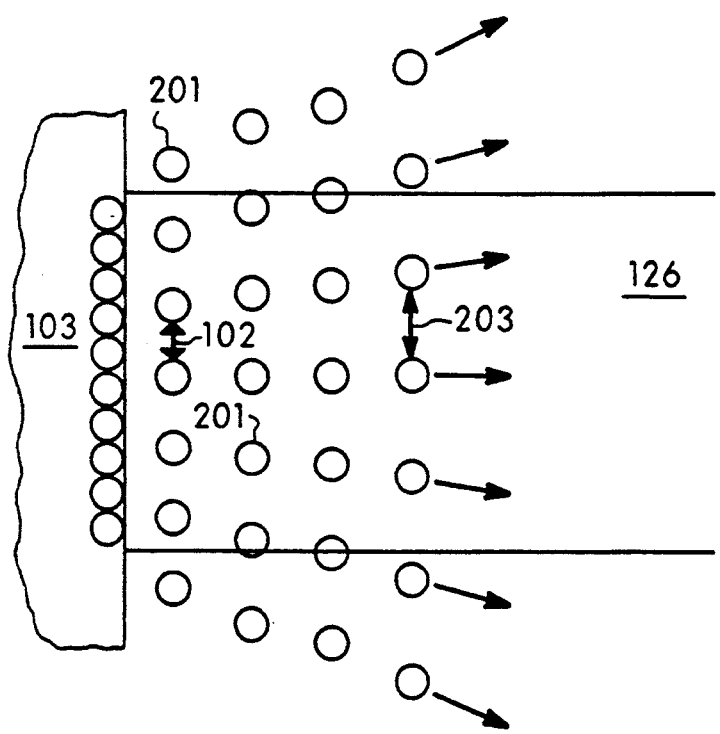
FIG. 2 shows a sputter target surface during near-resonant laser sputtering in accordance with the present invention.

In conventional laser sputtering, a laser having sufficient intensity or fluence is directed onto the surface of a sputtering target. The laser energy imparts enough energy to the surface atoms of the target material to remove the surface atoms from the target and propel the removed atoms toward a nearby substrate 102 (shown in FIG. 1). As shown in FIG. 2, laser light 126 causes atoms 201 near the surface of target 103 to move from the surface in all directions. In this aspect of laser sputtering, the laser sputtering apparatus of the present invention operates similarly to existing laser sputtering apparatus. Until now, laser sputtering without any other energy source was not reactive. The deposited thin film was substantially identical in composition to the material removed from the surface of target 103 in conventional laser sputtering methods. In order to cause an endothermic chemical reaction to occur after the atoms were removed, separate RF plasma apparatus or heating apparatus had to be included to provide the energy needed to induce the reaction.

In accordance with the present invention, as atoms 201 are removed from the surface of target 103, they remain illuminated by laser beam 126 for a finite time. In this time, atoms 201 absorb energy from laser light 126. In accordance with the present invention, laser light 126 is chosen to have a wavelength corresponding to an electronic transition in outer shell electrons of atoms 201 from a ground energy state to an excited energy state. Preferably the excited state is a metastable state, meaning that atoms 201 have a high probability of remaining in the excited state for some finite time. For Zn, the $4^3P$ state has a nominal lifetime of about $2\times10^{-5}$ seconds, but effective lifetimes near $6\times10^{-5}$ seconds have been observed. Where the metastable excited state is of sufficient duration, and the excited energy state has sufficient energy, there is a high likelihood that a chemical reaction between the excited atoms 201 and the reagent gases in vacuum chamber 101 will occur.

Atoms 201 have sufficient energy when the difference between the excited metastable state energy and the ground state energy is greater than the energy required to cause the desired chemical reaction. For example, a reaction between Zn and $O_2$ requires 25 kilocalorie per mole (kcal/mole) when the outer shell Zn electrons are in their ground state. In other words, a reaction between Zn and $O_2$ is endothermic, requiring external energy before the chemical reaction can occur when the Zn atoms are in the ground state. In the case of ground state Zn, the outer shell has two electrons in the $4^1S$ energy state. Zn also happens to have a metastable $4^3P$ excited state that lies 93 kcal/mole above the $4^1S$ ground state. A reaction between Zn excited to the $4^3P$ state and $O_2$ is exothermic by 68 kcal/mole. Hence, Zn atoms excited to the $4^3P$ energy state will readily react with $O_2$ to form ZnO.

In accordance with the present invention, the wavelength of laser light 126 is chosen to correspond to the transition energy to excite atoms 201 from their ground state to an excited metastable state. When atoms 201 are Zn, laser light 126 must provide the 93 kcal/mole (approximately 4.03 electron volts) transition energy to cause an electronic transition between the $4^1S$ ground state and the $4^3P$ excited state. It has been found that a suitable wavelength is provided by a XeCl excimer laser that has an output at 308 nanometers. All of the group II atoms have metastable states and transition energies that are accessible with available laser frequencies. This combination of using a laser to both sputter atoms from the target surface and to excite those atoms to a reactive state in accordance with the present invention is referred to herein as resonant laser sputtering.

3. Near-Resonant Laser Sputtering

As described above, laser sputtering involves exciting electrons from the ground energy state to an excited energy state in which the energy state is a metastable state. Transitions of electrons between energy states, however, require application of an extremely specific amount of energy corresponding to the difference in energy between the two states. In other words, conventional wisdom dictates that to cause an energy transition efficiently requires use of a laser wavelength corresponding to the exact energy of the transition between a ground state and an excited metastable state of the sputtered material. Conventional wisdom also suggests that near-resonant laser energy would result in extremely inefficient reactive sputtering with low product yield.

It has been discovered, however, that surprisingly efficient reactive sputtering can occur even when the laser wavelength is not exactly resonant with the electronic transition between the ground state and the excited state. As atoms 201 travel away from target 103, they become separated from each other by a greater and greater distance as is seen by comparing distances 202 and 203. Thus, as the atoms traverse the distance from surface of target 103, their electronic properties change from those of a solid state material to those of individual atoms.

Figure 3:
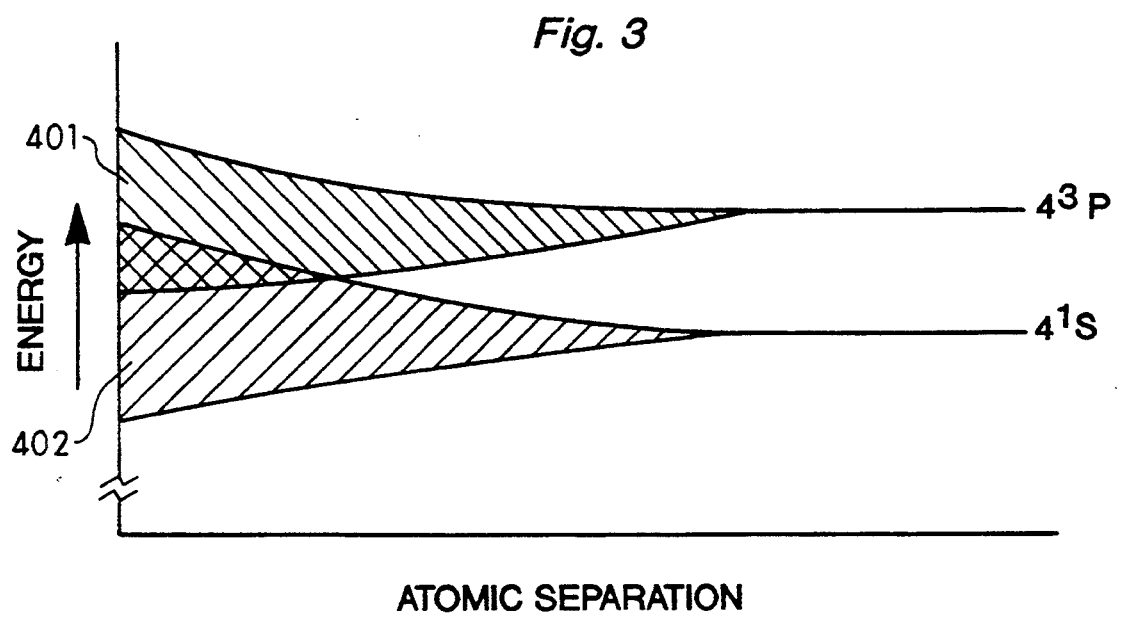
FIG. 3 illustrates qualitatively energy band and energy states as a function of atomic separation.

This change in electronic properties is illustrated graphically in FIG. 3. FIG. 3 shows energy on the vertical axis compared to atomic separation or the distance between atoms on the horizontal axis. The intersection of the vertical and horizontal axes occurs at an atomic separation corresponding to a solid surface. For ease of illustration, the vertical axis in FIG. 3 aligns with the surface of target 103 in FIG. 2. It should be understood that the graph in FIG. 3 is qualitative only. It is included to aid understanding of the present invention, however, FIG. 3 does not represent precise relationships between energy bands or energy states in any particular material.

With minimal atomic separation, the energy bands of a metal, including a conduction band 401 and a valence band 402, overlap, as shown at the far left of FIG. 3. This is characteristic of a metal resulting in a large number of free electrons from the valence band 402 filling vacancies in the conduction band 401, allowing free flow of electrons and, hence, high conductivity. At the far right hand side of FIG. 3 are represented energy states of the fourth shell of a Zn atom. As set out before, ground state Zn has two electrons in the $4^1S$ subband of the fourth shell, which is the outermost shell of the Zn atom. The $4^3P$ energy state is empty in the ground state.

It has been found that laser beam 126 causes a transition in sputtered Zn atoms between the ground state $4^1S$ electrons and the metastable state $4^3P$ electrons even when it is not precisely resonant with the transition energy. This unexpected excitation occurs when the sputtered Zn atoms are less than about one nanometer from the surface of sputtering target 103. This distance has not been quantified experimentally but is estimated based upon consideration of Zn dimers. In other words, even though the transition energy is somewhat greater or lesser than the energy of laser beam 126, the Zn atoms are excited to the $4^3P$ state. This is believed to be because the reaction occurs in the brief transit time while Zn atoms 201 (FIG. 2) have a very small atomic separation and are simultaneously bathed in laser light 126. This combination of events results in excitation of electrons from the ground state to the excited metastable state at a time when the atomic proximity still allows broadened energy "bands" to exist rather than discrete atomic energy states as shown in FIG. 3. This unique combination of events results in surprisingly efficient excitation of Zn atoms 201 even when the frequency or wavelength of laser light 126 is not exactly resonant with the electronic transition between the ground state and the first excited state.

In summary, near-resonant laser sputtering involves excitation of atoms sputtered from a target surface with laser light of a wavelength chosen to be approximately resonant with an electronic transition between a ground state and a metastable state of the sputtered atom. Because the excitation process takes place very near the surface of the sputtered target a wider range of laser frequencies can be used that provide an unexpectedly high yield of the sputter product. After the sputtered atoms react with a reagent gas in the vacuum chamber, they deposit onto a substrate to form a thin film of the reaction product.

4. Experimental Results

Figure 4:
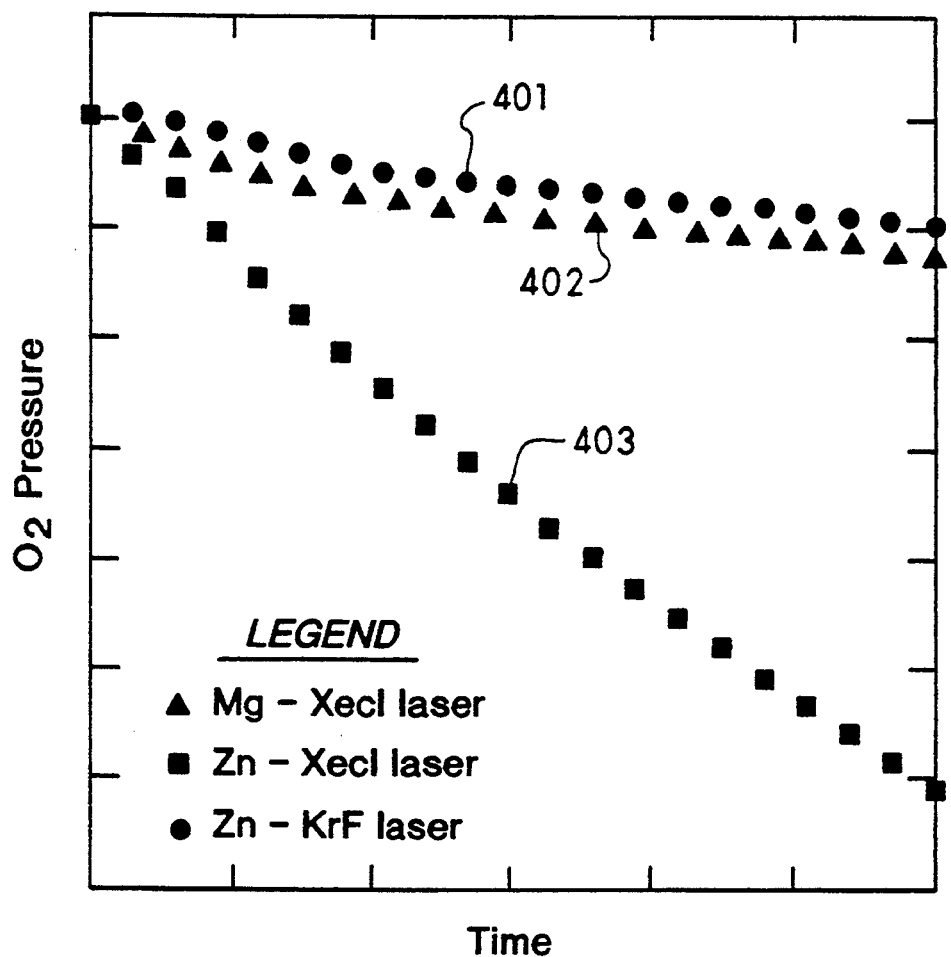
FIG. 4 illustrates a comparison of reaction rates between near-resonant and non resonant laser sputtering.

FIG. 4 illustrates results of an experimental sputter apparatus showing the difference between non resonant laser conditions and near-resonant laser conditions on sputter yield. The vertical axis in FIG. 4 is oxygen pressure in vacuum chamber 101 (shown in FIG. 1). The horizontal axis in FIG. 4 represents time. Because the oxygen pressure decreases when the sputtered atoms react with the oxygen, oxygen pressure is a good indicator of the efficiency of the reaction between the sputtered atoms and the oxygen in the reaction chamber.

An experimental sputtering apparatus was used having a thirteen centimeter diameter cylinder for the vacuum chamber. Transparent window 104 was provided by a fused silica window. A Zn target 103 was cleaned by light abrasion, washed in a commercial detergent, and positioned adjacent to a fused silica or single crystal silicon substrate. The experimental sputtering apparatus also had a 2.5 cm fused silica window 121 for observing the sputtering process. In the experimental sputtering apparatus, laser fluence was about one joule/cm$^2$ and controlled with focussing optics (not shown). The vacuum chamber 101 was pumped down to approximately $10^{-6}$ Torr, then the reagent gas added to a pressure of about three Torr. Positioning substrate 102 (indicated by the dashed circle 102 in FIG. 1) perpendicular to the surface of target 103 provide best results.

Experiments were conducted using a variety of reagent gases including reagent grade $O_2$ and $H_2S$ as well as $CS_2$ that was purified by a number of freeze-thaw cycles prior to evaporation into a pyrex bulb and mixed with a helium diluent. Neither the reaction chamber, target, nor reagent gasses were intentionally heated during the experiments.

The upper curve 401 in FIG. 4 illustrates sputtering with a Zn target using a krypton fluoride (KrF) excimer laser. The wavelength of the KrF excimer laser beam is approximately 249 nanometers and thus is far off-resonance with the electronic transition in Zn. Curve 401 shows that little $O_2$ is consumed during the off-resonance sputtering, indicating that the Zn sputtered using a KrF excimer laser is not reactive with oxygen at room temperature.

The middle curve 402 in FIG. 4 illustrates sputtering of a magnesium (Mg) target with a XeCl laser. Xenon chloride emits a laser beam having a 308 nanometer wavelength, which is again far off-resonance with the electronic transition in Mg, that occurs at about 457 nanometers. Curve 402 shows that little $O_2$ is consumed during the off-resonance sputtering, indicating that the Mg sputtered using a XeCl excimer laser is not reactive with oxygen at room temperature. It should be understood that in the off-resonance sputtering illustrated by curves 401 and 402, the target atoms are still sputtered from the surface, but they do not react with the oxygen or other reagent gases in vacuum chamber 101.

In stark contrast to the upper curves, the lower curve 403 illustrates sputtering using a Zn target illuminated with a XeCl excimer laser. As set out hereinbefore, the XeCl output at 308 nanometers is near-resonant with the $4^1S$ to $4^3P$ transition in Zn. Here it can be seen that oxygen pressure decrease steadily with increasing time indicating continuing reaction of oxygen with the sputtered Zn product.

Visible accumulations of zinc oxide films are apparent in the near-resonance sputtering in accordance with the present invention. Study of the ZnO films formed in accordance with the method of the present invention revealed uniform grain sizes ranging from 50 to 300 nanometer in diameter. Ultraviolet and visible light spectroscopy studies of the sputtered reaction product suggested stoichiometry near that of pure ZnO and indicated good optical quality. X-ray diffraction studies of the sputtered reaction product revealed a highly oriented polycrystalline <002> ZnO film formed by the method of the present invention.

It is believed that good stoichiometry and film morphology are tied to the specific excitation of the Zn atoms to a particular reactive state. In contrast, conventional plasma or chemical vapor deposition (CVD) reactors excite reagent gases to a broad range of energy states. This is an important advantage in application of the method of the present invention to more complex thin films, for example, production of thin films involving mixtures of group II metals. Specific excitation to particular energy states of these metals may allow fine control of the stoichiometries of such films.

It is to be expressly understood that the claimed invention is not to be limited to the description of the preferred embodiment but encompasses other modifications and alterations within the scope and spirit of the inventive concept. For example, tunable dye lasers can be used instead of excimer lasers. Other reagent gases may be used. Further, although the present invention is particularly useful for forming thin films of II-VI compounds, other materials and elements can be reactively laser sputtered.

I claim:

1. A laser sputtering method comprising the steps of:
providing a vacuum chamber having a reagent gas inlet and a transparent window;
providing a substrate inside the vacuum chamber and having a surface;
providing a sputter target comprising a first material composition, wherein the first material composition includes an element in Group II of the periodic table and wherein the sputter target is located inside the vacuum chamber and has a surface in proximity with the substrate;
providing a laser outside of the vacuum chamber, wherein the laser produces a laser beam having a wavelength;
supplying a reagent gas comprising a second material to the vacuum chamber via the reagent gas inlet, wherein the second material comprises an element in Group VIA of the periodic table;
directing the laser beam through the transparent window onto the target surface thereby removing atoms from the target surface;
illuminating the removed atoms with the laser beam to excite electrons having a ground state energy in the removed atom into a metastable energy state; and
causing a chemical reaction to occur between the excited removed atoms and the reagent gas to form a compound of the first material and the second material, wherein the compound deposits onto the substrate as a thin film.

2. The laser sputtering method of claim 1 wherein the first material comprises zinc.

3. The laser sputtering method of claim 2 wherein the laser is a xenon-chloride (XeCl) excimer laser and the wavelength is approximately 308 nanometers.

4. The laser sputtering method of claim 2 wherein the second material comprises molecules having oxygen atoms.

5. The laser sputtering method of claim 4 wherein the compound comprises zinc oxide (ZnO).

6. The laser sputtering method of claim 1 wherein the chemical reaction occurs while the vacuum chamber is substantially free of radio frequency energy.

7. A laser sputtering method comprising the steps of:
providing a vacuum chamber having a reagent gas inlet and a transparent window;

providing a substrate inside the vacuum chamber and having a surface;

providing a sputter target comprising a first material composition, wherein the first material composition include an element in Group II of the periodic table and wherein the sputter target is located inside the vacuum chamber and has a surface in proximity with the substrate;

providing a laser outside of the vacuum chamber, wherein the laser produces a laser beam having a wavelength;

supplying a reagent gas comprising a second material to the vacuum chamber via the reagent gas inlet, wherein the second material comprises an element in Group VIA of the periodic table;

directing the laser beam through the transparent window onto the target surface thereby removing atoms from the target surface;

illuminating the removed atoms with the laser beam to excite electrons having a ground state energy in the removed atoms into a metastable energy state; wherein the metastable energy state has sufficient energy to cause a room temperature reaction with the reagent gas; and causing a chemical reaction to occur between the excited removed atoms and the reagent gas to form a compound of the first material and the second material, wherein the compound deposits onto the substrate as a thin film.

8. A method for laser sputtering atoms from a target comprising a group II metal, the method comprising the steps of:

supplying a reagent gas comprising molecules having atoms from group VIA of the periodic table to a surface of the target;

directing a laser beam having a wavelength onto the surface of the target thereby sputtering atoms from the surface of the target;

illuminating the removed atoms with the laser beam while the removed atoms are still in proximity with the surface of the target to excite electrons having a ground state energy in the removed atoms into a metastable state energy, thereby causing a chemical reaction to occur between the excited removed atoms and the group VIa atoms in the reagent gas to form a group II–VI compound.

9. The method of claim 8 wherein the wavelength is chosen to be near resonant with a difference in energy between the metastable state energy and the ground state energy.

10. The method of claim 8 wherein the target comprises Zn, the reagent gas comprises $O_2$, the laser is an XeCl excimer laser, and the group II–VI compound comprises ZnO.

11. The method of claim 10 wherein the group II–VI compound comprises polycrystalline ZnO.

12. A method for laser sputtering atoms from a target comprising a group II metal, the method comprising the steps of:

supplying a reagent gas comprising molecules having atoms from group VIA of the periodic table to a surface of the target;

directing a laser beam having a wavelength onto the surface of the target thereby sputtering atoms from the surface of the target;

illuminating the removed atoms with the laser beam while the removed atoms are still in proximity with the surface of the target to excite electrons having a ground state energy in the removed atoms into a metastable state energy thereby causing a chemical reaction to occur between the excited removed atoms and the group VIA atoms in the reagent gas to form a group II–VI compound wherein the metastable state energy is sufficient to cause the chemical reaction at room temperature.

13. A method of forming a oxide thin film comprising the steps of:

providing a vacuum chamber;

supplying a reagent gas comprising oxygen to the vacuum chamber at a pressure of about three Torr;

sputtering zinc atoms from a target inside the vacuum chamber using a laser having an output wavelength near 308 nanometers, thereby exciting the zinc atoms into a metastable energy state having sufficient energy to cause a chemical reaction between the zinc atoms and the oxygen in the reagent gas to form zinc oxide on a substrate.

* * * * *